(12) United States Patent
Cleris et al.

(10) Patent No.: US 10,020,816 B1
(45) Date of Patent: Jul. 10, 2018

(54) HYBRID SUCCESSIVE APPROXIMATION REGISTER ANALOG TO DIGITAL CONVERTER

(71) Applicant: Intel Corporation, Santa Clara, CA (US)

(72) Inventors: Mauro Cleris, Fosso (IT); Sergio Walter, Villach (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/684,378

(22) Filed: Aug. 23, 2017

(51) Int. Cl.
*H03M 1/38* (2006.01)
*H03K 5/24* (2006.01)

(52) U.S. Cl.
CPC ............... *H03M 1/38* (2013.01); *H03K 5/24* (2013.01)

(58) Field of Classification Search
CPC .................................... H03M 1/38; H03K 5/24
USPC .................................................. 341/155, 161
See application file for complete search history.

(56) References Cited

U.S. PATENT DOCUMENTS

| 3,581,304 | A * | 5/1971 | Paradise | H03M 1/00 341/156 |
| 4,275,386 | A * | 6/1981 | Michel | H03M 1/125 341/159 |
| 7,986,253 | B2 * | 7/2011 | Cho | H03M 1/0695 341/118 |
| 9,667,268 | B2 * | 5/2017 | Girardi | H03M 1/46 |

* cited by examiner

*Primary Examiner* — Brian Young
(74) *Attorney, Agent, or Firm* — Eschweiler & Potashnik, LLC

(57) ABSTRACT

Systems, methods, and circuitries for converting an analog voltage to a digital signal are provided. In one example a method to convert an analog voltage into a binary sequence that represents the voltage includes two modes. In the first mode, in each cycle, values for a next two or more of consecutive most significant bits (MSBs) in the sequence are determined using M comparators, wherein M is equal to or greater than 3. In a second mode, in each cycle, M redundant comparison results are determined using the M comparators. A value for the LSB is determined based on the M redundant values. At an end of conversion, the sequence of N bit values is generated based on the MSBs and the LSB.

19 Claims, 4 Drawing Sheets

US 10,020,816 B1

HYBRID SUCCESSIVE APPROXIMATION REGISTER ANALOG TO DIGITAL CONVERTER

BACKGROUND

Analog-to-digital converters (ADCs) are utilized in virtually every electronic device. For example in, wireless communication devices ADCs are used to convert received analog signals to equivalent digital signals for baseband processing. Some ADCs include successive approximation registers (SARs). SAR-based ADCs perform an iterative sorting-based algorithm on an input analog voltage to determine a value for each bit in the digital signal, which is stored in the SAR. At the end of conversion (EOC), after a value for each bit has been determined, the ADC outputs the content of the SAR which is a digital signal that encodes the determined bit values.

DETAILED DESCRIPTION

Figures 1, 2:
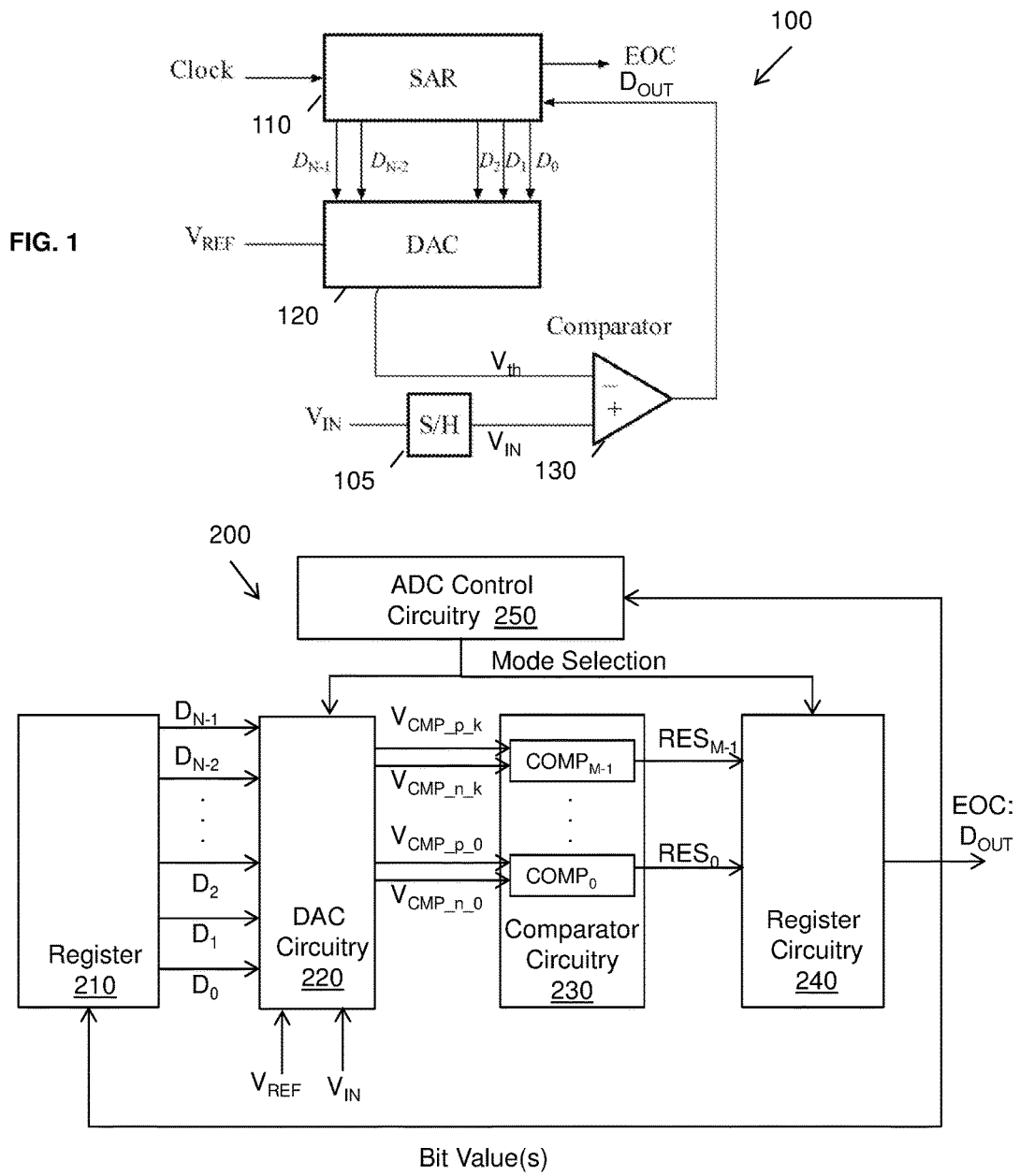
FIG. 1 illustrates an exemplary SAR-based ADC that determines a single bit value per cycle.
FIG. 2 illustrates an exemplary SAR-based ADC that functions in a first mode in which values for at least two bits are determined per cycle and in a second mode in which a value for a single bit is redundantly determined per cycle in accordance with various aspects described.

FIG. 1 illustrates a one-bit-per-cycle SAR-based ADC 100 that converts an analog voltage ($V_{IN}$) to a digital output signal ($D_{OUT}$) which is a binary sequence including N bits. The ADC 100 includes a sample and hold circuit 105, a SAR 110, a digital-to-analog converter (DAC) 120, and a comparator 130. A digital sample of $V_{IN}$ is stored in the sample and hold circuit 105. Each clock cycle (hereinafter "cycle"), a next bit (starting from the most significant bit (MSB)) of the SAR content is updated based on an output of the comparator 130. The DAC 120 generates an analog threshold voltage $V_{th}$ based on the bit values already determined. The DAC 120 adjusts the threshold voltage by progressively smaller increments, depending on the significance of the bit being determined. The comparator 130 compares the threshold voltage to the analog input voltage to determine the value (1 or 0) for the next bit in the SAR. At an "end of conversion" (EOC), the contents of the SAR are output as an N bit $D_{OUT}$ that represents, as close as possible, the analog input voltage $V_{IN}$.

It can be seen that a single-bit-per-cycle SAR-based ADC, such as the one illustrated in FIG. 1, consumes one clock cycle per bit in $D_{OUT}$. As the number of bits in the digital output signal increases, a SAR-based DAC may incur significant speed performance limitations. Further, during determination of the least significant bits (LSBs) in the SAR, the incremental change in threshold voltage may approach the magnitude of noise in the system. This reduces the signal to noise ratio (SNR) of the SAR-based ADC.

Described herein are systems and methods in which a SAR-based ADC is operated in two modes. In a first mode a plurality of comparators are used to determine at least two MSB values per clock cycle. In a second mode the plurality of comparators are used to determine redundant single LSB values and a final LSB value with improved SNR is determined based on the redundant LSB values. In some embodiments, an additional comparator is used to balance the loads seen from capacitor arrays in the ADC and also to generate an additional redundant LSB value, further increasing the SNR of the SAR-based ADC.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

FIG. 2 illustrates one example of a SAR-based ADC 200 that operates in two modes as controlled by ADC control circuitry 250. The ADC 200 includes a register 210, DAC circuitry 220, comparator circuitry 230, and register circuitry 240. The comparator circuitry 230 includes M comparator circuits capable of performing M comparison operations in parallel. Each comparison operation compares a positive input voltage $V_{CMP\_p}$ to a negative input voltage $V_{CMP\_n}$ to perform a sorting algorithm on $V_{IN}$. The register circuitry 240 generates values for one or more bits of register bits $D_{N-1}$ to $D_0$ based on the comparison results ($RES_{M-1}$ to $RES_0$). The ADC control circuitry 250 controls the DAC circuitry 230 to generate appropriate positive input voltages and negative input voltages (e.g., $V_{CMP\_p\_k}$ and $V_{CMP\_n\_k}$ where k=M−1, . . . , 0) depending on which register bits are being determined and/or the selected mode of operation. The ADC control circuitry 250 also controls the register circuitry 240 to determine, in a single clock cycle, either multiple bit values or a single bit value for the register bits based on the comparison results depending on the selected mode of operation. At EOC, the ADC control circuitry generates $D_{OUT}$, which is a binary sequence based on the register bits determined during the first and second modes of operation.

In the first mode, the ADC 200 determines values for multiple bits of the register content (i.e., two or more consecutive bits in the sequence of "register bits" $D_{N-1}$ to $D_0$) in a single clock cycle. To accomplish this, the comparator circuitry 230 includes M comparator circuits capable of performing M different comparison operations in parallel. Each comparison operation compares a different combination of positive input voltage and negative input voltage to generate a different comparison result (e.g., $RES_{M-1}$ to $RES_0$). The DAC circuitry 230, as controlled by the ADC control circuitry 250, determines, based on the register bits in the register 210, the positive input voltage and the negative input voltage (e.g., $V_{CMP\_p\_k}$ and $V_{CMP\_n\_k}$) input to each of the comparators. The register circuitry 240, as controlled by the ADC control circuitry 250, determines a value of the multiple register bits based on the result produced by the comparators. In one embodiment, the ADC control circuitry 250 causes the ADC 200 to operate in the first mode to determine a predetermined number of MSBs of register bits.

In the second mode of operation, the ADC control circuitry 250 controls the DAC circuitry to generate a positive input voltage and negative input voltage pair for each comparator in the comparator circuitry 230 that has the same differential (e.g., $\Delta V_{CMP\_0} = \Delta V_{CMP\_1} = \ldots = \Delta V_{CMP\_k}$). Thus, each comparator result (e.g., $RES_{M-1}$ to $RES_0$) is a single bit that communicates whether the positive input voltage is greater than or less than the negative input voltage. The comparator results in the second mode are thus redundant. The ADC control circuitry 250 controls the register circuitry 240 to determine a single register bit value based on the M redundant comparison results. For example, the register circuitry 240 may determine the LSB value to be the comparison result generated by a majority of the comparators. In this manner, the SNR of the ADC is increased while the number of bits determined per cycle is decreased. In one embodiment, the ADC control circuitry 250 controls the ADC 200 to operate in the second mode to determine a predetermined number of LSBs of the register bits.

At EOC, the register circuitry 240 generates $D_{OUT}$, which includes at least N bits. In one embodiment, the register circuitry generates $D_{OUT}$ based on M sequences of N bits, where each of the M sequences includes, in common, the MSBs generated during the first mode of operation. Each of the M sequences includes one of the redundant LSB(s) value(s) determined by one of the M comparators. For example, the register circuitry 240 may determine an average value of the M sequences and output the average as an N bit sequence corresponding to $D_{OUT}$. In another example, the register circuitry 240 may sum the M sequences and output the sum and as a sequence corresponding to $D_{OUT}$ that includes more than N bits. In this embodiment, $D_{OUT}$ communicates a digital value having fraction of a bit resolution.

Figure 3:
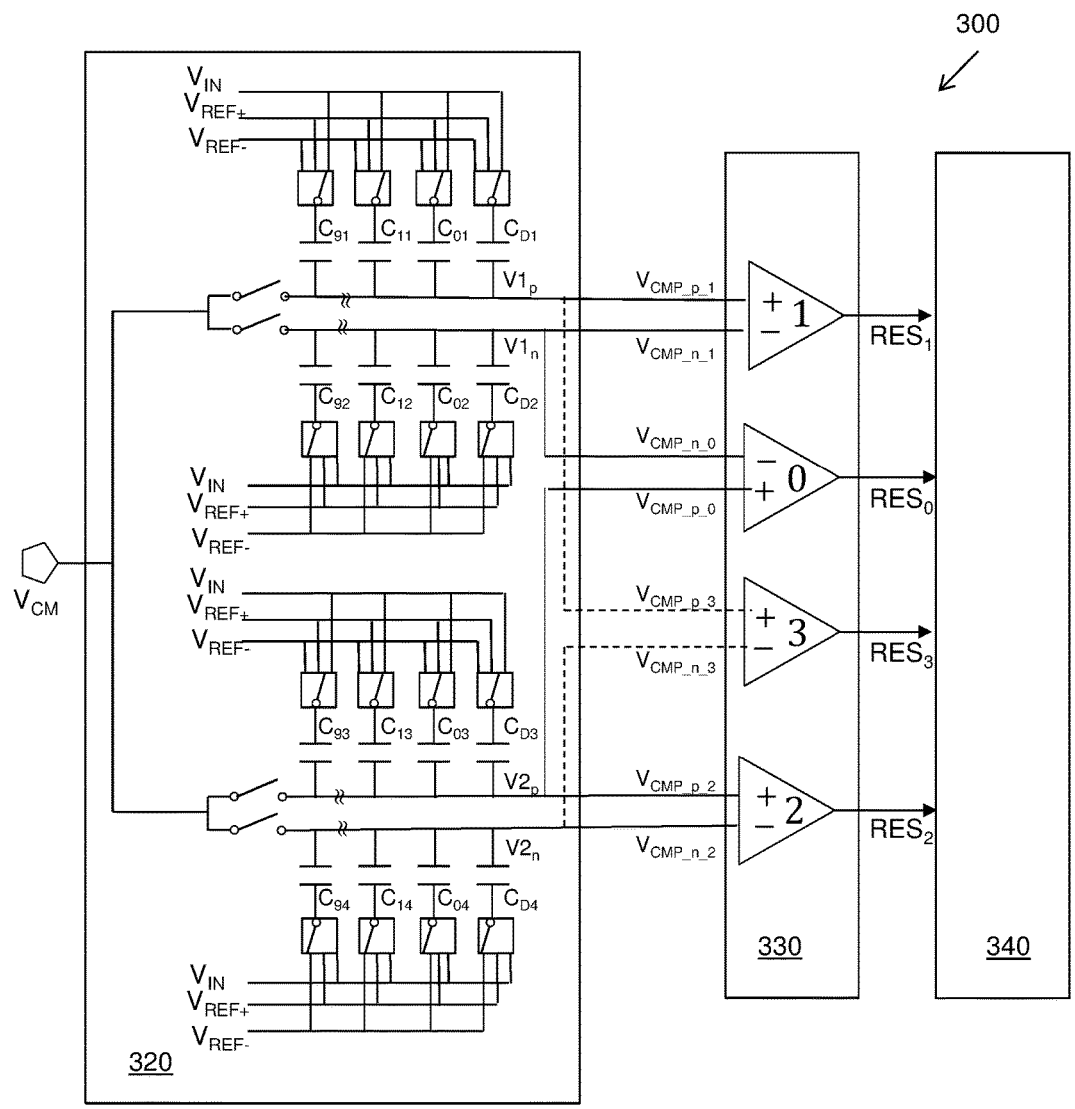
FIG. 3 illustrates an exemplary SAR-based ADC that functions in a first mode in which values for two bits are determined per cycle and in a second mode in which a value for a single bit is redundantly determined per cycle in accordance with various aspects described.
Figure 4:
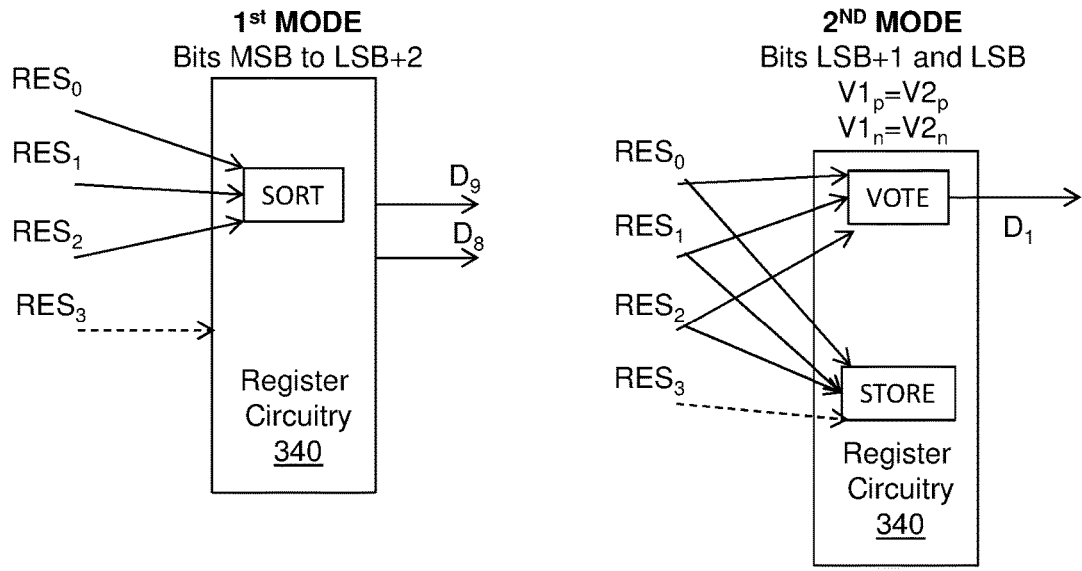
FIG. 4 illustrates three modes of operation of the exemplary SAR-based ADC of FIG. 3 in accordance with various aspects described.
Figure 4:
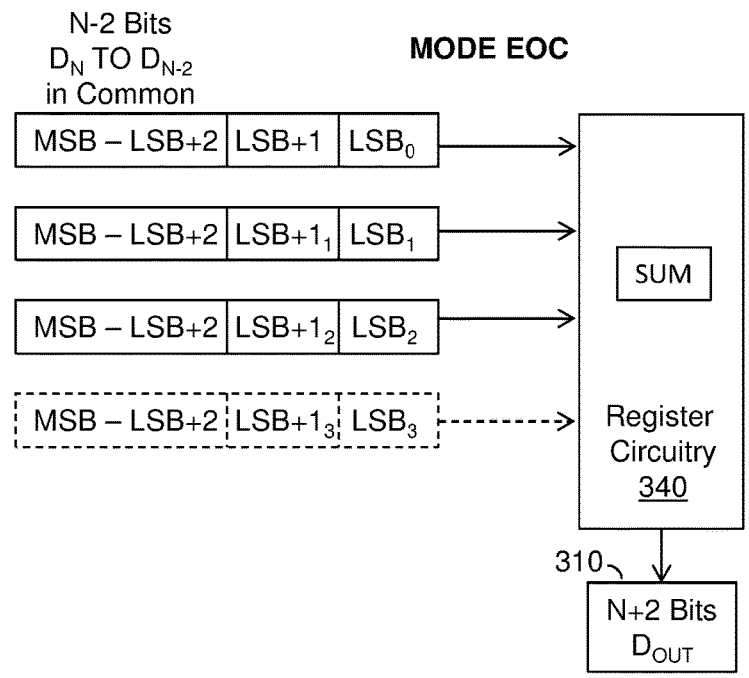

FIGS. 3 and 4 illustrate one example of a DAC 320, a comparator circuitry 330, and a register circuitry 340 that enable a SAR-based ADC such as the one illustrated in FIG. 2 to determine two bits per clock cycle (i.e., in the first mode of operation). The DAC 320 inputs 10 register bits from a SAR (not shown, see register 210 in FIG. 2) as well as a common mode voltage $V_{CM}$, two reference voltages $V_{REF+}$ and $V_{REF-}$, and the analog input voltage $V_{IN}$ that is being converted to a digital signal. While the example illustrated in FIG. 3 includes 10 register bits, any number of register bits may be used.

The DAC 320 includes four capacitor banks, each including 11 capacitors. In each bank there is one capacitor for each register bit ($C_9$ for MSB-$C_0$ for LSB) and one "dummy" capacitor ($C_D$). The capacitance of the capacitors $C_9$-$C_0$ increases by a factor of two so that $C_1$ has a capacitance that is twice the capacitance of $C_0$, $C_2$ has a capacitance that is twice the capacitance of $C_1$, and so on. The dummy capacitor has the same capacitance as $C_0$. Each capacitor bank generates either a positive input voltage (e.g., $V1_p$ or $V2_p$) or a negative input voltage ($V1_n$ r $V2_n$) that is connected to either a positive or negative terminal of two of four comparators (labeled 0-3) in the comparator circuitry 330. During the input voltage sampling phase, one terminal of each capacitor is connected to a common mode voltage $V_{CM}$. The other terminal of each capacitor is connected through a three-pole switch to a selected one of VIN, $VREF_+$, or $VREF_-$. The switches are controlled by the DAC 320 to first store VIN in the capacitors and then, based on the result of each successive comparison operation, connect each capacitor to either $VREF_+$ or $VREF_-$. The DAC 320 controls the switches in each bank to selectively connect and disconnect the capacitors to the different potentials to generate the a next desired positive input voltages and negative input voltages (e.g., $V_{CMP\_p\_k}$ and $V_{CMP\_n\_k}$) to be input to each comparator.

It is noted that to determine the value of two bits in a single clock cycle, three comparisons (dividing the range of possible values into four quarters) are needed. Thus, only three comparators are necessary to resolve two bit values. Comparator 0's $RES_0$ indicates a value for the MSB bit in the pair (e.g., which half of the range the value for the two bits falls). Comparator 1's $RES_1$ indicates a value for the LSB in the pair when the MSB of the pair is 1. Comparator 2's $RES_2$ indicates a value for the LSB when the MSB of the pair is 0. However, only using three comparators will cause an imbalance in the loading of the capacitor banks because only two of the three banks would experience the additional input impedance of a second comparator.

To address this issue, a fourth comparator (labeled 3) can be added that is connected to the second capacitor bank symmetrically with respect to the first capacitor bank. The comparison result $RES_3$ generated by the fourth comparator is not needed to determine register bit values, however, $RES_3$ can be used to increase SNR in LSB determination during the second mode of operation as will be described in more detail with reference to FIG. 4. This means that when a fourth comparator is used to balance the capacitance, the additional cost and power consumption can be somewhat offset or justified by generating a digital output signal with higher SNR. In some examples, the design illustrated in FIG. 3 is extended to include more capacitor banks and more comparators may be used to enable the ADC to determine 3 or more bit values in a single cycle during the first mode of operation.

FIG. 4 illustrates the register circuitry 340 operating in the first mode, the second mode, and at end of conversion (EOC). The register circuitry 340 inputs the results of the three comparators ($RES_0$ to $RES_2$) and, if used, the result of the optional fourth comparator $RES_3$. In the example illustrated in FIGS. 3 and 4, there are 10 register bits, and in the first mode of operation, the eight MSBs are determined, two bits per clock cycle. In the second mode of operation, the two LSBs are determined, one bit per clock cycle. In other examples, more or less MSBs and/or LSBs can be determined during the first and/or second mode of operation.

During the first mode of operation, the register circuitry 340 determines two MSB values (D9 and D8 are shown as an example) based on the results of three comparators as described above with reference to FIG. 3. Thus, in the first mode of operation, the comparators in the comparator circuitry 330 (FIG. 3) are performing comparison operations using positive input voltages and negative input voltages. The register circuitry 340 is performing a sorting operation based on the threshold determinations communicated by the comparison results. The ADC operates in the first mode for four cycles.

During the second mode of operation, the DAC 330 (FIG. 3) sets the positive input voltages equal and the negative input voltages equal for the comparators. Each comparator thus determines a redundant comparison value for a single bit. The register circuitry 340 determines the value of one register bit (e.g., first LSB+1 then LSB) in a cycle by setting the register bit equal to the most popular/majority comparison result (i.e., 1 or 0) as between the three comparison results. An odd number of comparison results are used to determine the register bit values to avoid a tie situation. In this manner, redundant results can be used to improve the reliability of the register bit LSBs (leading to higher SNR of the complete ADC). This is beneficial because the LSB determination is more corruptible/prone to mistake due to noise than the MSB determination. The register circuitry 440 also stores the redundant comparison result for each comparator, including the fourth load balancing comparator when used. The ADC operates in the second mode for two cycles.

After values for all ten register bits have been determined, the register circuitry 340 generates $D_{OUT}$ based on the register bits as follows. The register circuitry 340 inputs three sequences of bits (or four if the optional fourth comparator is used). Each sequence includes the MSB values, in common, that were determined in the first mode of operation. Each sequence includes the stored LSB values for one of the comparators. Thus, in the example of FIG. 4, each sequence includes 10 bit values. The register circuitry 340 generates $D_{OUT}$ based on the sequences. In one example, the register circuitry 340 adds the sequences to generate a 12 bit "sum" sequence that is $D_{OUT}$. The 12 bit sequence corresponds to a 10 bit integer and a 2 bit (LSBs) fractional value. In other examples, the register circuitry 340 averages the sequences and rounds to a 10 bit integer to generate $D_{OUT}$.

Figure 5:
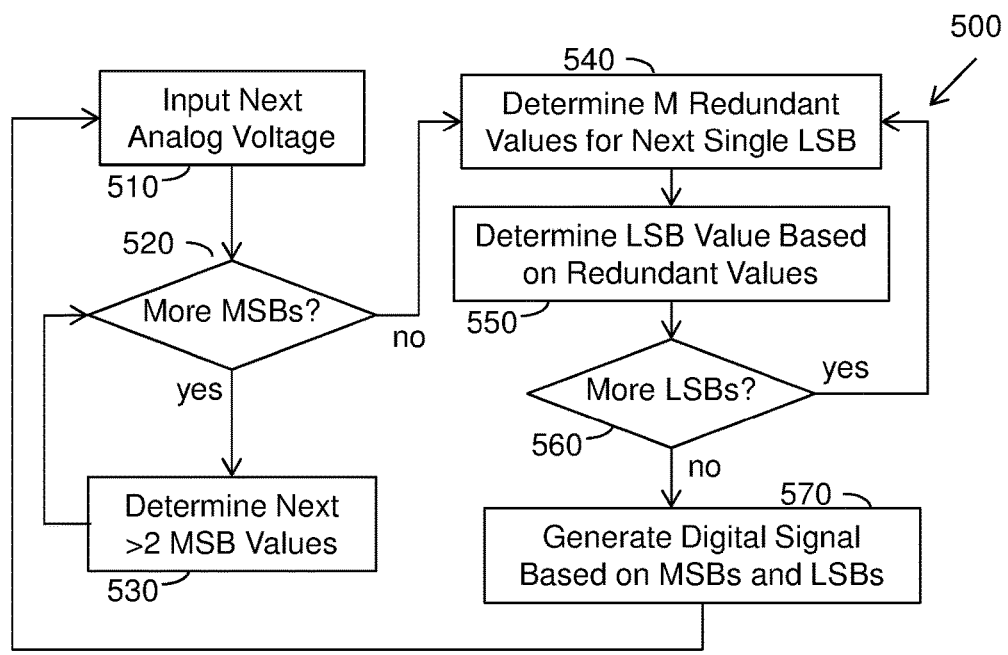
FIG. 5 illustrates a flow diagram of an exemplary method for converting an analog voltage to a digital binary sequence in accordance with various aspects described.

FIG. 5 illustrates a flow diagram outlining one embodiment of a method 500 to convert an analog voltage into a digital signal comprising a binary sequence that represents the voltage. The method 500 may be performed, for example, by the ADC 200 or 300 of FIGS. 2-4. The method includes, at 510, inputting a next analog voltage to be converted. At 520, a determination is made as to whether all MSB values in a register have been determined (e.g., if the ADC is operating in the first mode). If all MSB values have not been determined, at 530 in a single cycle M comparators are used to determine values for a next two or more of consecutive most significant bits (MSBs) in the register based on the analog voltage and register bit values stored in the register. M is equal to or greater than 3. If All MSB values have been determined (e.g., the ADC is operating in the second mode) at 540 the method includes determining at least M redundant values for a next single bit in the least significant bits (LSBs) in the register using the M comparators. At 550, a value for the LSB is determined based on the at least M redundant values. At 560, a determination is made as to whether all LSB values have been determined. If so, at 570, the method includes generating the digital signal based on the MSBs and the LSBs (e.g., the register bit values) stored in the register.

It can be seen from the foregoing description a SAR-based ADC that determines values for MSBs two or more bits at a time with a plurality of comparators and then determines redundant values for LSBs using the plurality of comparators provides faster analog to digital conversion time (as compared to single bit per cycle ADCs) while also enhancing the SNR of the analog to digital conversion. Further, when an additional comparator is included for load balancing purposes, the additional comparator may be used to further increase the SNR of the SAR-based ADC when determining the LSB value(s).

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for converting an analog voltage into a binary sequence that represents the voltage according to embodiments and examples described.

Example 1 is a method to convert an analog voltage into a binary sequence that represents the voltage, including receiving the analog voltage and then operating in two modes. In the first mode, in each cycle, M comparators are used to determine values for a next two or more of consecutive most significant bits (MSBs) in a register based on the analog voltage and register bit values stored in the register. M is equal to or greater than 3. In the second mode, in each cycle, at least M redundant comparison results are determined using the M comparators; and a value for a next least significant bit (LSB) in the register is determined based on the at least M redundant comparison results. The binary sequence is generated based at least on the MSBs and the LSBs in the register.

Example 2 includes the subject matter of Example 1, including or omitting optional elements, wherein determining the values for the next two or more of consecutive MSBs in the register includes: with the M comparators, performing different M comparison operations to generate M comparison results, wherein each comparison operation compares a respective positive input voltage to a respective negative input voltage to generate a respective comparison result, wherein each of the M comparators compares a different combination of positive input voltage and negative input voltage as compared to the others of the M comparators; and generating the values for the next two or more consecutive MSBs based on the M comparison results.

Example 3 includes the subject matter of Example 1, including or omitting optional elements, wherein determining at least M redundant values for a single LSB in the register includes, with the at least M comparators, performing at least M comparison operations, wherein each comparison operation compares a positive input voltage and negative input voltage having a same differential to generate the M redundant comparison results.

Example 4 includes the subject matter of Example 1, including or omitting optional elements, wherein determining the value for the next LSB based on the three redundant comparison results includes selecting a redundant comparison result generated by a majority of the M comparators.

Example 5 includes the subject matter of Example 1-4, including or omitting optional elements, further including: for each of the M comparators, generating a sequence of N bits that includes the MSB values and a redundant comparison result for the LSB generated by the comparator; and generating the binary sequence based at least on the M sequences of N bits.

Example 6 includes the subject matter of Example 5, including or omitting optional elements, further including: adding the M sequences to generate a sum sequence including more than N bits; and determining the binary sequence based at least on the sum sequence.

Example 7 includes the subject matter of Example 1-4, including or omitting optional elements, further including, in the second mode, in each cycle: determining M+1 redundant comparison results for the next single bit in the least significant bits (LSBs) in the register using the M comparators and an additional comparator; and determining a value for the next LSB based on the M+1 redundant comparison results.

Example 8 is an analog-to-digital converter (ADC) configured to convert an analog voltage into a binary sequence that represents the voltage, including: a register configured to store bit values; register circuitry configured to determine the bit values; M comparators; and ADC control circuitry configured to control the ADC to operate in a first mode or a second mode. In the first mode, in each cycle, the register circuitry is configured to determine values for a next two or more of consecutive most significant bits (MSBs) in the register based on comparison results of the comparators; and in the second mode, in each cycle, the register circuitry is configured to determine a value for a next single bit in the least significant bits (LSBs) in the register based on the at least M redundant comparison results. The register circuitry is configured to generate the binary sequence based on the MSBs and the LSBs in the register.

Example 9 includes the subject matter of Example 8, including or omitting optional elements, further including digital-to-analog converter (DAC) circuitry configured to generate a positive input voltage and a negative input voltage pair for each comparator based on a digital sample of the analog voltage and the bit values in the register.

Example 10 includes the subject matter of Example 9, including or omitting optional elements, wherein in the first mode, in each cycle, the DAC circuitry is configured to generate a different positive input voltage and negative input voltage pair for each comparator based on the analog voltage and register bit values stored in the register, such that each of the M comparators compares a different combination of positive input voltage and negative input voltage as compared to the others of the M comparators.

Example 11 includes the subject matter of Example 9, including or omitting optional elements, wherein in the second mode, in each cycle, the DAC circuitry is configured to generate a positive input voltage and negative input voltage pair having a same differential for each comparator based on the analog voltage and register bit values stored in the register, such that the comparators generate M redundant comparison results.

Example 12 includes the subject matter of Example 11, including or omitting optional elements, wherein the register circuitry is configured to determine the value for the next LSB by selecting a redundant comparison result generated by a majority of the at least M comparators.

Example 13 includes the subject matter of Example 8-12, including or omitting optional elements, wherein the register circuitry is further configured to: for each of the at least M comparators, generate a sequence of N bits that includes the MSB values and a redundant comparison result for the LSB generated by the comparator; and generate the binary sequence based at least on the at least M sequences of N bits.

Example 14 includes the subject matter of Example 13, including or omitting optional elements, wherein the register circuitry is further configured to: add the at least M sequences to generate a sum sequence including more than N bits; and determine the binary sequence based at least on the sum sequence.

Example 15 includes the subject matter of Example 8-12, including or omitting optional elements, further including: an additional comparator such that the total number of comparators is M+1; wherein in the second mode, in each cycle, the DAC circuitry is configured to generate the same positive input voltage and negative input voltage pair for each of the M+1 comparators based on the analog voltage and register bit values stored in the register, such that the comparators generate M+1 redundant comparison results; and the register circuitry is configured to determine a value for the next LSB based on the M+1 redundant comparison results.

Example 16 is ADC control circuitry configured to, in response to receiving an analog voltage for conversion to a binary sequence: control DAC circuitry and register circuitry to operate in a first mode and a second mode. In the first mode, in each cycle, the DAC circuitry generates a different positive input voltage and negative input voltage pair for each of M comparators based on the analog voltage and register bit values stored in a register, such that each of the M comparators compares a different combination of positive input voltage and negative input voltage as compared to the others of the M comparators. The ADC control circuitry is configured to control the register circuitry to determine values for a next two or more of consecutive most significant bits (MSBs) in the register based on the M comparison results. In response to a predetermined number of MSBs being determined, the ADC control circuitry is configured to control the DAC circuitry to operate in the second mode wherein, in each cycle, the DAC circuitry is configured to generate a positive input voltage and negative input voltage pair having a same differential for each of the M comparators based on the analog voltage and register bit values stored in the register, such that the comparators generate M redundant comparison results. The ADC control circuitry is configured to control the register circuitry to operate in the second mode, wherein, in each cycle, the register circuitry determines a value for a next LSB based on the M redundant comparison results; and in response to a predetermined number of LSBs being determined, control the register circuitry to generate the binary sequence based at least on the MSBs and LSBs in the register.

Example 17 includes the subject matter of Example 16, including or omitting optional elements, further configured, in the second mode, to control the register circuitry to determine the value for the next LSB by selecting a redundant comparison result generated by a majority of the at least M comparators.

Example 18 includes the subject matter of Example 16, including or omitting optional elements, further configured, in response to the predetermined number of LSBs being determined, to control the register circuitry to: for each of the at least M comparators, generate a sequence of N bits that includes the MSB values and a redundant comparison result for the LSB generated by the comparator; and generate the binary sequence based at least on the at least M sequences of N bits.

Example 19 includes the subject matter of Example 18, including or omitting optional elements, further configured, in the second mode, to control the register circuitry to add the at least M sequences to generate a sum sequence including more than N bits; and determine the binary sequence based at least on the sum sequence.

Example 20 includes the subject matter of Example 16-19, including or omitting optional elements, further configured to, in the second mode, in each cycle: control the DAC circuitry to generate a positive input voltage and negative input voltage having a same differential for each of M+1 comparators based on the analog voltage and register bit values stored in the register, such that comparators generate M+1 redundant comparison results; and control the register circuitry to determine a value for the next LSB based on the M+1 redundant comparison results.

Example 21 is an apparatus configured to convert an analog voltage into a binary sequence that represents the voltage, including: means for receiving the analog voltage; means for using M comparators to determine, in a first mode, in each cycle, values for a next two or more of consecutive most significant bits (MSBs) in a register based on the analog voltage and register bit values stored in the register, wherein M is equal to or greater than 3; means for using M comparators to determine, in a second mode, in each cycle, at least M redundant comparison results using the M comparators; and a value for a next least significant bit (LSB) in the register based on the at least M redundant comparison results; and means for generating the binary sequence based at least on the MSBs and the LSBs in the register.

Example 22 includes the subject matter of Example 21, including or omitting optional elements, wherein the means for using M comparators to determine the values for the next two or more of consecutive MSBs in the register includes: means for using the M comparators to perform different M comparison operations to generate M comparison results, wherein each comparison operation compares a respective positive input voltage to a respective negative input voltage to generate a respective comparison result, wherein each of the M comparators compares a different combination of positive input voltage and negative input voltage as compared to the others of the M comparators; and means for generating the values for the next two or more consecutive MSBs based on the M comparison results.

Example 23 includes the subject matter of Example 21, including or omitting optional elements, wherein the means for determining at least M redundant values for a single LSB in the register includes, means for using the at least M comparators to perform at least M comparison operations, wherein each comparison operation compares a positive input voltage and negative input voltage having a same differential to generate the M redundant comparison results.

Example 24 includes the subject matter of Example 21-23, including or omitting optional elements, wherein the means for generating the binary sequence includes means for generating, for each of the M comparators, a sequence of N bits that includes the MSB values and a redundant comparison result for the LSB generated by the comparator; and means for generating the binary sequence based at least on the M sequences of N bits.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:
1. A method to convert an analog voltage into a binary sequence that represents the voltage, comprising:
   receiving the analog voltage;
   in a first mode, in each cycle, using M comparators to determine values for a next two or more of consecutive most significant bits (MSBs) in a register based on the analog voltage and register bit values stored in the register, wherein M is equal to or greater than 3;

in a second mode, in each cycle:
determining at least M redundant comparison results using the M comparators; and
determining a value for a next least significant bit (LSB) in the register based on the at least M redundant comparison results; and
generating the binary sequence based at least on the MSBs and the LSBs in the register.

2. The method of claim 1, wherein determining the values for the next two or more of consecutive MSBs in the register comprises:
with the M comparators, performing different M comparison operations to generate M comparison results, wherein each comparison operation compares a respective positive input voltage to a respective negative input voltage to generate a respective comparison result, wherein each of the M comparators compares a different combination of positive input voltage and negative input voltage as compared to the others of the M comparators; and
generating the values for the next two or more consecutive MSBs based on the M comparison results.

3. The method of claim 1, wherein determining at least M redundant values for a single LSB in the register comprises, with the at least M comparators, performing at least M comparison operations, wherein each comparison operation compares a positive input voltage and negative input voltage having a same differential to generate the M redundant comparison results.

4. The method of claim 1, wherein determining the value for the next LSB based on the at least M redundant comparison results comprises selecting a redundant comparison result generated by a majority of the M comparators.

5. The method of claim 1, further comprising:
for each of the M comparators, generating a sequence of N bits that includes the MSB values and a redundant comparison result for the LSB generated by the comparator; and
generating the binary sequence based at least on the M sequences of N bits.

6. The method of claim 5, further comprising:
adding the M sequences to generate a sum sequence including more than N bits; and
determining the binary sequence based at least on the sum sequence.

7. The method of claim 1, further comprising, in the second mode, in each cycle:
determining M+1 redundant comparison results for the next single bit in the least significant bits (LSBs) in the register using the M comparators and an additional comparator; and
determining a value for the next LSB based on the M+1 redundant comparison results.

8. An analog-to-digital converter (ADC) configured to convert an analog voltage into a binary sequence that represents the voltage, comprising:
a register configured to store bit values;
register circuitry configured to determine the bit values;
M comparators;
digital-to-analog converter (DAC) circuitry configured to generate a positive input voltage and a negative input voltage pair for each comparator based on a digital sample of the analog voltage and the bit values in the register;
ADC control circuitry configured to control the ADC to operate in a first mode or a second mode, wherein:
in the first mode, in each cycle, the register circuitry is configured to determine values for a next two or more of consecutive most significant bits (MSBs) in the register based on comparison results of the comparators; and
in the second mode, in each cycle, the register circuitry is configured to determine a value for a next single bit in the least significant bits (LSBs) in the register based on the at least M redundant comparison results; and
wherein the register circuitry is configured to generate the binary sequence based on the MSBs and the LSBs in the register.

9. The ADC of claim 8, wherein in the first mode, in each cycle, the DAC circuitry is configured to generate a different positive input voltage and negative input voltage pair for each comparator based on the analog voltage and register bit values stored in the register, such that each of the M comparators compares a different combination of positive input voltage and negative input voltage as compared to the others of the M comparators.

10. The ADC of claim 8, wherein in the second mode, in each cycle, the DAC circuitry is configured to generate a positive input voltage and negative input voltage pair having a same differential for each comparator based on the analog voltage and register bit values stored in the register, such that the comparators generate M redundant comparison results.

11. The ADC of claim 10, wherein the register circuitry is configured to determine the value for the next LSB by selecting a redundant comparison result generated by a majority of the M comparators.

12. The ADC of claim 8, wherein the register circuitry is further configured to:
for each of the M comparators, generate a sequence of N bits that includes the MSB values and a redundant comparison result for the LSB generated by the comparator; and
generate the binary sequence based at least on the M sequences of N bits.

13. The ADC of claim 12, wherein the register circuitry is further configured to:
add the at least M sequences to generate a sum sequence including more than N bits; and
determine the binary sequence based at least on the sum sequence.

14. The ADC of claim 8, further comprising:
an additional comparator such that the total number of comparators is M+1;
wherein in the second mode, in each cycle,
the DAC circuitry is configured to generate a same positive input voltage and negative input voltage pair for each of the M+1 comparators based on the analog voltage and register bit values stored in the register, such that the comparators generate M+1 redundant comparison results; and
the register circuitry is configured to determine a value for the next LSB based on the M+1 redundant comparison results.

15. ADC control circuitry configured to:
in response to receiving an analog voltage for conversion to a binary sequence:
control DAC circuitry to operate in a first mode wherein, in each cycle, the DAC circuitry generates a different positive input voltage and negative input voltage pair for each of M comparators based on the analog voltage and register bit values stored in a register, such that each of the M comparators compares a different combination of positive input voltage and negative input voltage as compared to the others of the M comparators; and control register circuitry to operate in the first mode wherein, in each cycle, the register circuitry determines values for a next two or more of consecutive most significant bits (MSBs) in the register based on the M comparison results;

in response to a predetermined number of MSBs being determined:

control the DAC circuitry to operate in a second mode wherein, in each cycle, the DAC circuitry is configured to generate a positive input voltage and negative input voltage pair having a same differential for each of the M comparators based on the analog voltage and register bit values stored in the register, such that the comparators generate M redundant comparison results; and control the register circuitry to operate in the second mode, wherein, in each cycle, the register circuitry determines a value for a next LSB based on the M redundant comparison results; and in response to a predetermined number of LSBs being determined, control the register circuitry to generate the binary sequence based at least on the MSBs and LSBs in the register.

16. The ADC control circuitry of claim 15, further configured, in the second mode, to control the register circuitry to determine the value for the next LSB by selecting a redundant comparison result generated by a majority of the M comparators.

17. The ADC control circuitry of claim 15, further configured, in response to the predetermined number of LSBs being determined, to control the register circuitry to:

for each of the M comparators, generate a sequence of N bits that includes the MSB values and a redundant comparison result for the LSB generated by the comparator; and generate the binary sequence based at least on the M sequences of N bits.

18. The ADC control circuitry of claim 17, further configured, in the second mode, to control the register circuitry to:

add the at least M sequences to generate a sum sequence including more than N bits; and determine the binary sequence based at least on the sum sequence.

19. The ADC control circuitry of claim 15, further configured to, in the second mode, in each cycle:

control the DAC circuitry to generate a positive input voltage and negative input voltage pair having a same differential for each of M+1 comparators based on the analog voltage and register bit values stored in the register, such that comparators generate M+1 redundant comparison results; and control the register circuitry to determine a value for the next LSB based on the M+1 redundant comparison results.

* * * * *